United States Patent
Jungerman (10) Patent No.: US 6,756,775 B2
(45) Date of Patent: *Jun. 29, 2004

(54) QUASI-PERIODIC OPTICAL SAMPLING (75) Inventor: Roger L. Jungerman, Petaluma, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 360 days.

This patent is subject to a terminal disclaimer.

(21) Appl. No.: 09/919,155

(22) Filed: Jul. 31, 2001

(65) Prior Publication Data

US 2002/0196055 A1 Dec. 26, 2002

Related U.S. Application Data (63) Continuation-in-part of application No. 09/887,992, filed on Jun. 22, 2001, now Pat. No. 6,564,160.

(51) Int. Cl.[7] .......................... G01R 35/00; G06F 19/00
(52) U.S. Cl. .................................. 324/121 R; 702/106
(58) Field of Search .......................... 324/121 R, 76.58, 324/76.52, 76.64, 76.77, 120; 702/106, 76

(56) References Cited

U.S. PATENT DOCUMENTS 6,564,160 B2 * 5/2003 Jungerman et al. ......... 702/106

OTHER PUBLICATIONS

S. Nogiwa et. al, *Improvement of sensitivity in Optical Sampling System, Electronics Letters*, May 27, 1999, vol. 35, No. 11.

* cited by examiner

*Primary Examiner*—Albert Decady
*Assistant Examiner*—James C. Kerveros (57) ABSTRACT Repetitive sampling of a data signal is performed. A clock reference is generated. The clock reference has a known period relationship with the data signal. The clock reference and the data signal are simultaneously sampled. The sampling is performed at a known frequency. The sampled information from the clock reference and the known sampling frequency are used to determine in what phase of the clock reference sampled values of the data signal occur.

26 Claims, 10 Drawing Sheets

QUASI-PERIODIC OPTICAL SAMPLING

CROSS REFERENCE TO RELATED APPLICATIONS

This application is a continuation-in-part of United States patent application entitled "RANDOM SAMPLING WITH PHASE MEASUREMENT" filed on Jun. 22, 2001 and accorded Ser. No. 09/887,992, now U.S. Pat. No. 6,564,160.

BACKGROUND

The present invention concerns sampling methods used within oscilloscopes and pertains particularly to sampling with phase measurement In oscilloscopes, three different repetitive sampling methods are traditionally employed. Sequential sampling is used in equivalent time sampling scopes. In sequential sampling systems, each sample is taken at successively longer delays after a repetitive trigger event. Alternatively, the signal repetition frequency is phase locked to the sampling signal with a small fixed frequency offset. See S. Nogiwa et. al, *Improvement of sensitivity in Optical Sampling System*, Electronics Letters, May 27, 1999, Vol. 35, No. 11.

Non-sequential sampling is used in a microwave transition analyzer. The sampling pulses and the users signal are phase locked. Each has a more arbitrary, but known frequency.

The third repetitive sampling method is random sampling. In random sampling systems, the phase of the samples is typically not related to the repetitive signal input. The position of each sample on the time axis of the oscilloscope display is obtained by measuring the phase of each sample relative to a trigger signal. See, for example U.S. Pat. No. 4,884,020. For additional background information on random electrical sampling, see, for example, U.S. Pat. No. 5,315,627, U.S. Pat. No. 4,928,251, U.S. Pat. No. 4,719,416, U.S. Pat. No. 4,578,667 and U.S. Pat. No. 4,495,586.

In optical sampling oscilloscopes sequential sampling is typically used. There have been a number of disadvantages with the use of sequential sampling. For example, there is significant jitter in phase locking of the source. The narrow frequency range of the phased locked loop (PLL) used in such applications limits the range of input frequencies of the signal to be measured. Also, to construct a PLL, the phase must be measured and the source frequency controlled. Also the PLL requires an optical pulsed laser source with tunable repetition frequency which is expensive.

SUMMARY OF THE INVENTION

In accordance with the preferred embodiment of the present invention, repetitive sampling of a data signal is performed. A clock reference is generated. The clock reference has a known period relationship with the data signal. The clock reference and the data signal are simultaneously sampled. The sampling is performed at a known frequency. The sampled information from the clock reference and the known sampling frequency are used to determine in what phase of the clock reference sampled values of the data signal occur.

DESCRIPTION OF THE PREFERRED EMBODIMENT

In the preferred embodiments of the present invention, when a measured parameter is sampled, the time axis value of the sample can be determined by measuring an additional vertical channel at the same time or with a known timing relationship between the vertical channels. This additional vertical channel is called the clock reference. The clock reference is repetitive and there is a known period relationship between the data on the vertical axis and the clock reference.

The shape of the clock reference signal as a function of time is used to calculate the time value using a method such as a look-up table. The shape of the clock reference signal versus time can be determined by knowing an approximate functional form and then fitting numerous actual clock reference data points to the function using least square error or other curve fitting approaches to obtain a self-consistent description of the clock reference data points.

If another time base is used to give approximate information on the time of the sample, data from the clock reference can be used to compensate for jitter and place the time axis value of the point more accurately. An example is using a sequential time base with pattern trigger to give an approximate location of a sample and a clock reference signal to remove jitter up to one bit period.

Sampling the reference signal at a known frequency removes ambiguity when the clock reference is not single valued (e.g. rising or falling edge of a sine wave) and to improve accuracy at points where the slope of the clock reference signal verses time is small. Noise in the measurement of the vertical channel value of the clock reference will translate to a time error (jitter) inversely proportional to the slope of the clock reference versus time. In many practical systems a low jitter sequential time base is difficult to design, particularly over a wide range of frequencies. This clock reference approach makes it possible to effectively "time-stamp" each point. This reduces the potential system cost, allows the system to operate at a wide range of repetition frequencies and reduces the jitter.

Figure 1:
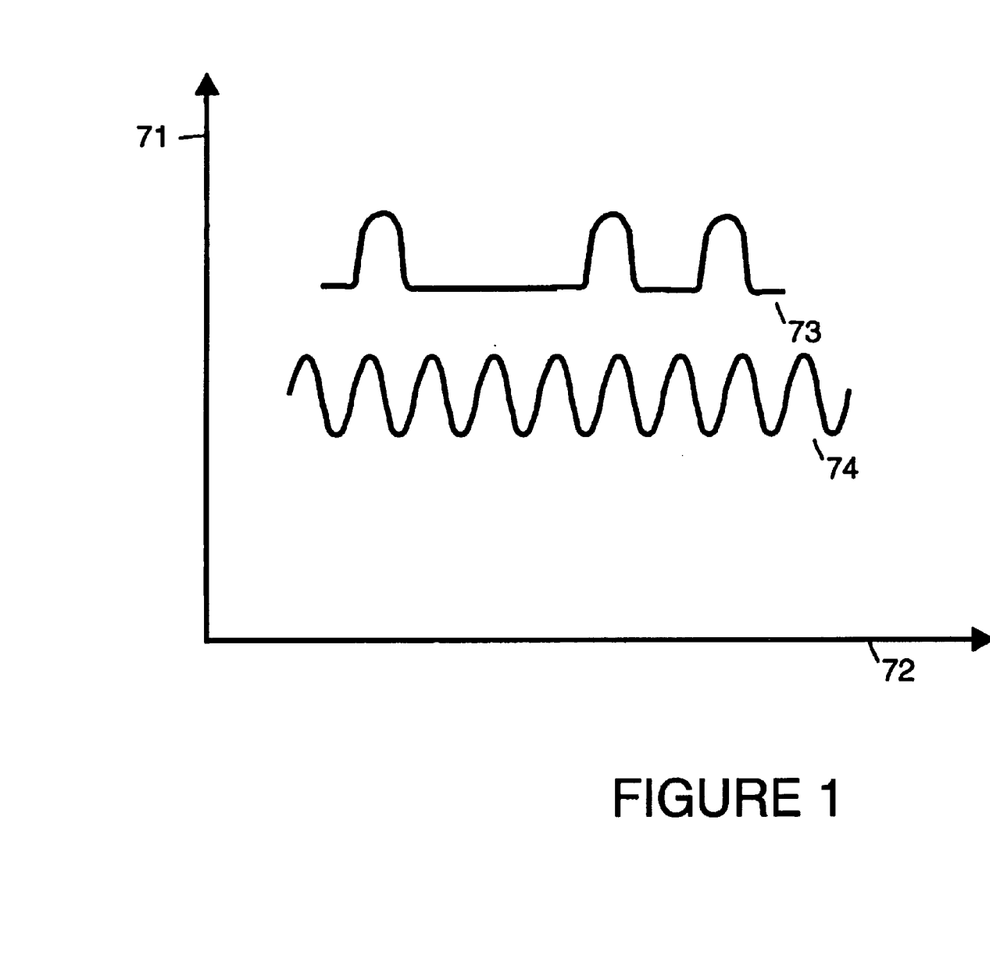
FIG. 1 shows a vertical axis, a horizontal axis, a waveform that represents vertical channel data and a waveform that represents a clock reference in accordance with a preferred embodiment of the present invention.

FIG. 1 shows a vertical axis 71 that represents voltage or optical power or some other measured value. For example, in alternative embodiments of the present invention, vertical axis 71 represents phase, modulation or some other measured value. A horizontal axis 72 represents time. For example, in alternative embodiments of the present invention, horizontal axis 72 represents frequency or some other value. In alternative embodiments of the present invention, the orientation of the horizontal axis and the vertical axis can also be switched, for example, so that the vertical axis is used to represent time or frequency and the horizontal axis is used to represent voltage, optical power, phase, modulation or some other measured value.

A waveform 73 represents vertical channel data. A waveform 74 represents a clock reference. For example, the clock reference has roughly a sinusoidal form. By simultaneously sampling the vertical channel data and the clock reference, sampling data can be taken in random order then reconstructed (sorted) over one period of the clock reference to form an eye diagram. This is represented in FIG. 2.

Figure 2:
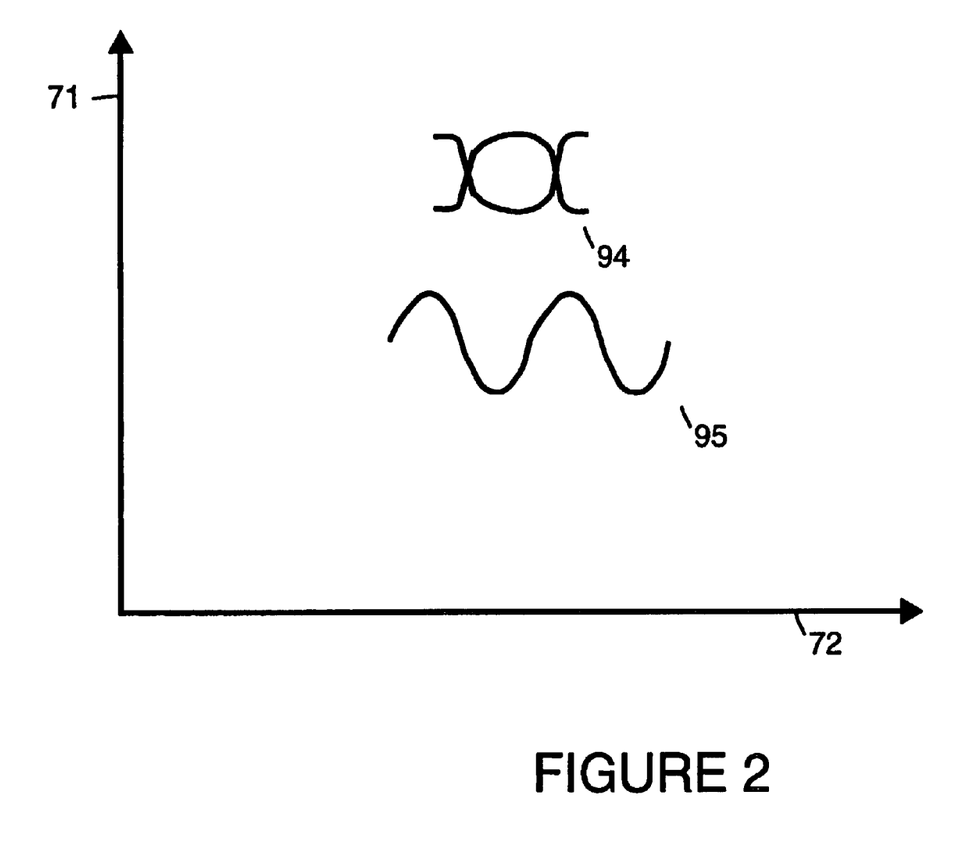
FIG. 2 shows a waveform that represents vertical channel data, roughly in the shape of an eye and a waveform that represents one cycle of the clock reference in accordance with a preferred embodiment of the present invention.

FIG. 2 shows vertical axis 71 and horizontal axis 72. A waveform 94 represents vertical channel data, roughly in the shape of an eye. A waveform 95 represents one cycle of the clock reference.

In a prior patent application entitled "RANDOM SAMPLING WITH PHASE MEASUREMENT" filed on Jun. 22, 2001 and accorded Ser. No. 09/887,992, now U.S. Pat. No. 6,564,160 a system using random sampling is described. One embodiment of that system determines the time placement of each sample by measuring quadrature phases of an electrical clock reference by optical sampling. This has the advantage of providing a time base jitter that is independent of jitter in the optical pulse source. However, the optical delay between the quadrature phases varies with frequency must be set mechanically. This adds cost and limits the range of frequencies that can be measured for a given delay range. Alternatively a second optical modulator can be added, increasing the range of frequency coverage, but adding still more to the cost. To obtain a triggered waveform (eye-line mode) with the quadrature time base approach requires still further complexity.

The present invention can be used in electrical sampling oscilloscope and in an optical sampling oscilloscope.

Figure 3:
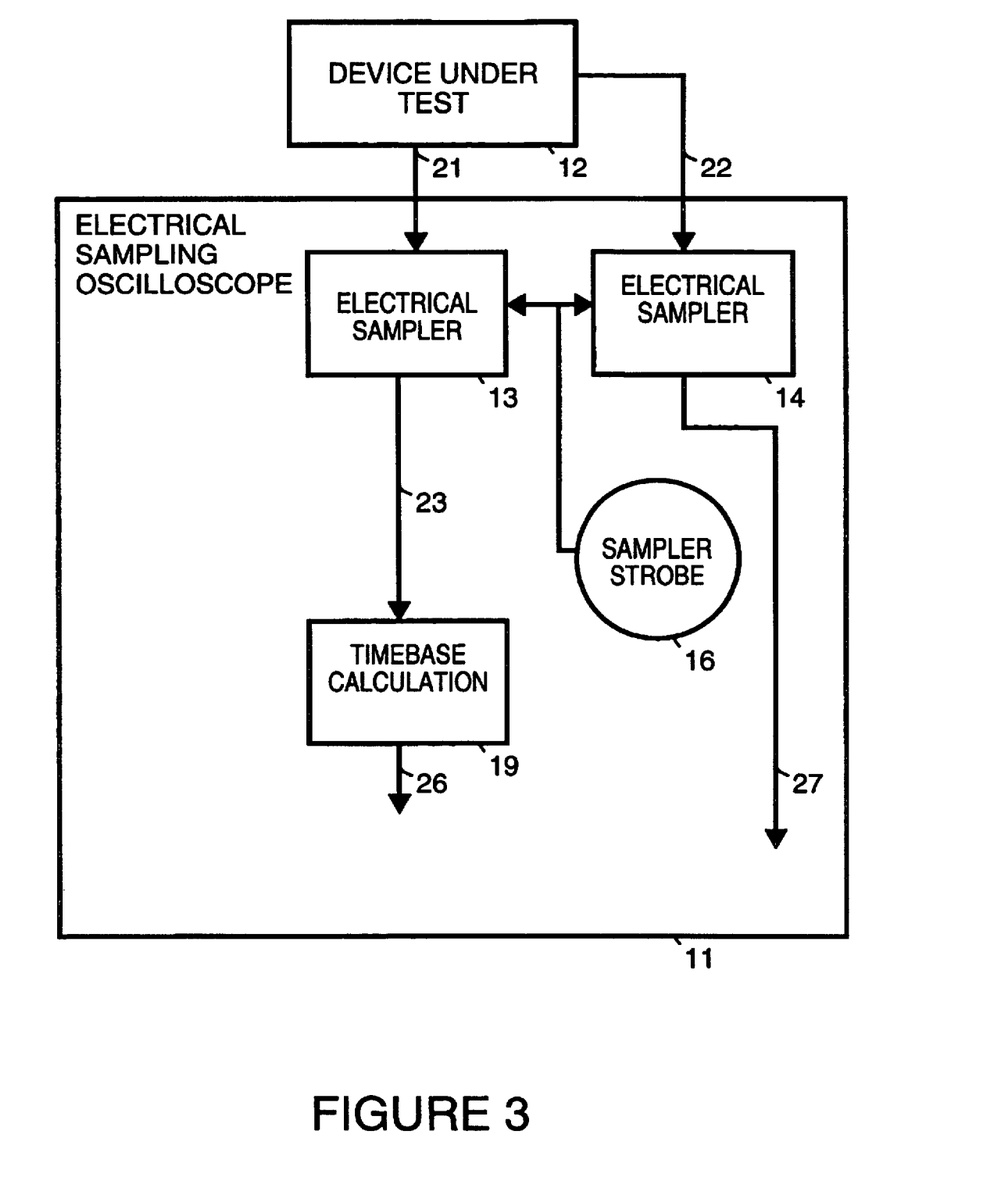
FIG. 3 is a simplified block diagram of an electrical sampling oscilloscope in accordance with a preferred embodiment of the present invention.

FIG. 3 is a simplified block diagram of an electrical sampling oscilloscope 11, also called a digital communications analyzer. A device under test 12 supplies to electrical sampling oscilloscope 11 a digital electrical data signal 22 and a synchronous electrical clock reference signal 21. Synchronous electrical clock reference signal 21 is used for horizontal time base information. Digital electrical data signal 22 is synchronous with electrical clock reference signal 21. Digital electrical data signal 22 is used for the vertical channel information.

A sampler strobe 16 is used to simultaneously strobe an electrical sampler 14 and an electrical sampler 13. Electrical sampler 14 and electrical sampler 13 thus sample at the same time. The strobe signal generated by sampler strobe 16 operates at a known frequency. Sampling at a known frequency allows a resolution of ambiguity as to whether each sampled point is on a rising or falling edge of electrical clock reference signal 21 and allows for improved accuracy at sampled points where the slope of electrical clock reference signal 21 verses time is small.

Electrical sampler 14 samples digital electrical data signal 22 and provides a vertical channel signal 27 which provides the vertical channel information used by oscilloscope 11 to generate a display.

Electrical sampler 13 samples synchronous electrical clock reference signal 21 and forwards results 23 to a time base calculation circuit 19. Time base calculation circuit 19 produces a time axis channel information reference signal 26.

Figure 4:
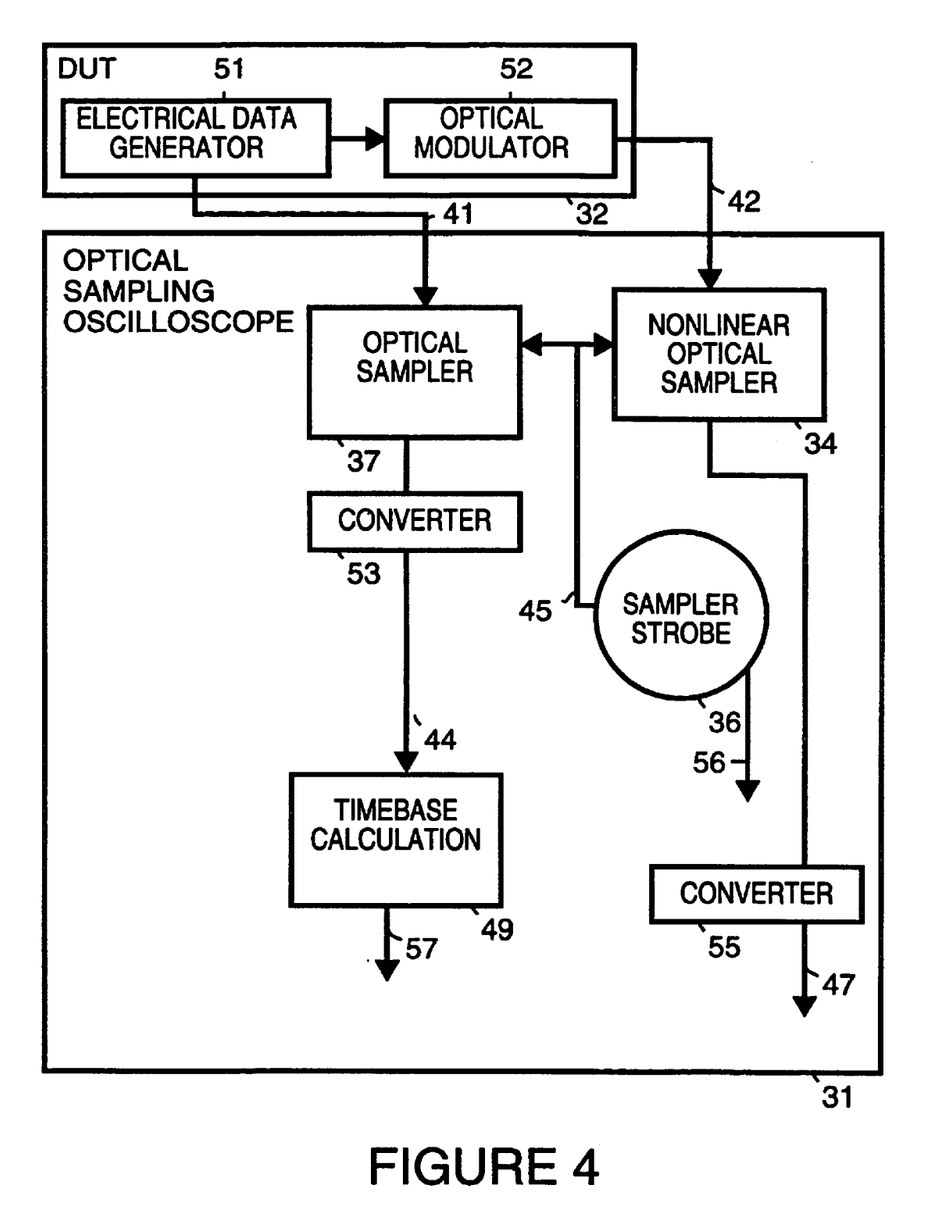
FIG. 4 is a simplified block diagram of an optical sampling oscilloscope in accordance with an alternative preferred embodiment of the present invention.

FIG. 4 is a simplified block diagram of an optical sampling oscilloscope 31. Optical sampling oscilloscope 31 is used, for example, to sample signals with bandwidths much higher than could be sampled by electrical sampling oscilloscope 11. For example, electrical sampling oscilloscope 11 performs sampling in the range of 50 gigahertz (GHz), while optical sampling oscilloscope 31 is able to perform sampling at bandwidths greater than one terahertz (THz).

A device under test 32 includes an electrical data generator 51 and an optical modulator 52. Electrical data generator 51 supplies to optical sampling oscilloscope 31 an electrical clock reference signal 41. Optical modulator 52 supplies to optical sampling oscilloscope 31 an optical data signal 42. Electrical clock reference signal 41 is synchronized with optical data signal 42.

Electrical clock reference signal 41 is used for horizontal time base information. Optical data signal 42 is synchronous with electrical clock reference signal 41. Optical data signal 42 is used for the vertical channel information.

A sampler strobe 36 is used to simultaneously strobe a non-linear optical sampler 34, and an optical sampler 37 with a strobe signal 45. Nonlinear optical sampler 34 and optical sampler 37 thus sample at the same time. The strobe signal generated by sampler strobe 36 operates at a known frequency. Sampling at a known frequency allows a resolution of ambiguity as to whether each sampled point is on a rising or falling edge of electrical clock reference signal 41 and allows for improved accuracy at sampled points where the slope of electrical clock reference signal 41 verses time is small.

Sampler strobe 36 is implemented, for example, using an optical pulse source, such as a passively mode-locked fiber ring laser available from IMRA America, Inc. having a business address of 1044 Woodridge Avenue, Ann Arbor, Mich. 48105. Such an optical pulse source typically has excellent phase noise at high frequencies.

Non-linear optical sampler 34 samples optical data signal 42. A slow optical/electrical and analog to digital converter 55 provides a vertical channel signal 47 which provides the vertical channel information used by oscilloscope 31 to generate a display.

Optical sampler 37 samples electrical clock reference signal 41 and forwards the results to a slow optical/electrical and analog to digital converter 53. Slow optical/electrical and analog to digital converter 53 sends a converted signal 44 to a time base calculation circuit 49. Time base calculation circuit 49 produces a time axis channel information reference signal 57.

For example, optical sampler 37 is implemented using a Mach Zehnder optical modulator. The insertion loss of the Mach Zehnder optical modulator is dependent on the instantaneous voltage on the modulator provided by the reference signals provided to the modulator. The optical sampling pulse amplitude (energy) is dependent on the insertion loss of the modulator. The optical pulse energy can be measured with a slow optical detector (e.g., a slow optical/electrical and analog to digital converter) Alternatively, optical sampler 37 can be implemented, for example, with a photoconductive switch (PCS) or other sampling device. Optical sampler 37 essentially operates as a phase detector of electrical clock reference signal 41.

Non-linear optical sampler 34 converts the wavelength of optical data signal 42 during the time aperture of the optical sampling pulse. The wavelength converted output is optically filtered and measured with a slow optical/electrical and analog to digital converter 55. Slow optical/electrical and analog to digital converter 55 measures converted pulse energy.

In instruments such as electrical sampling oscilloscope 11 and optical sampling oscilloscope 31, a measured parameter (e.g. voltage or optical power) is displayed on a vertical axis as a function of time represented on the horizontal axis.

In the preferred embodiment, sampler strobe 36 has excellent phase noise at high frequencies making it unnecessary to measure the jitter of every optical sampling pulse. By measuring electrical clock reference 41 with only occasional optical sampling pulses, low frequency jitter of strobe signal 45 can be compensated for. In addition, low frequency wander of electrical clock reference 41 can be tracked. The occasional electrical clock reference phase measurement can be performed using only a single quadrature phase. In fact, non-sinusoidal electrical clock reference waveforms can be used with appropriate calibration look-up tables. This simplifies the implementation of oscilloscope 31, reduces the cost, extends the operating frequency range, and enables the measurement of triggered waveforms (eye-line mode).

Figure 5:
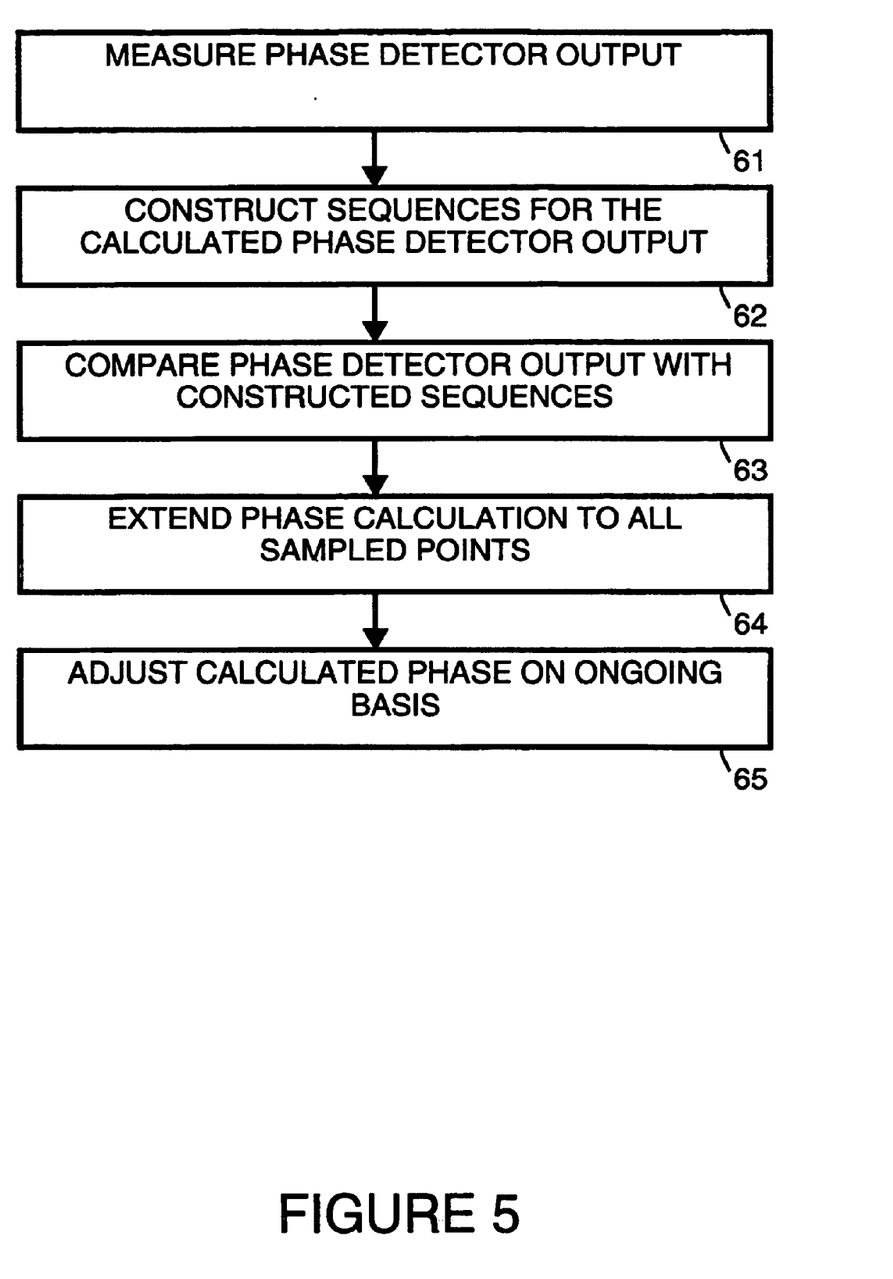
FIG. 5 is a flowchart that provides an overview of quasi-periodic optical sampling in accordance with a preferred embodiment of the present invention.

FIG. 5 is a flowchart that provides an overview of quasi-periodic optical sampling calculations as performed, for example by time base calculation circuit 49.

In a step 61, samples within converted signal 44 are used when the samples are within a high slope window where the slope of electrical clock reference signal 41 is significant. This insures a good phase measurement.

Figure 6:
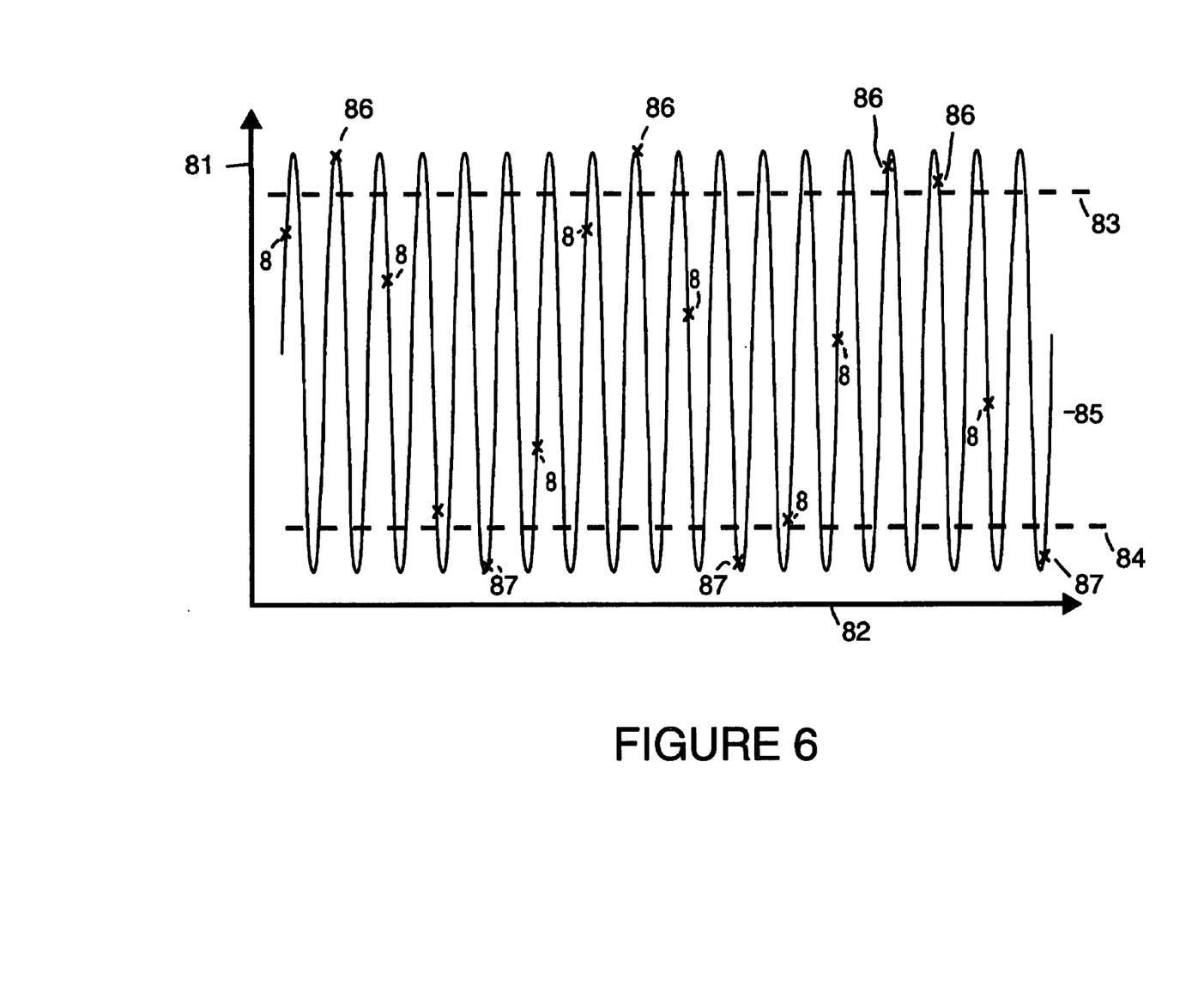
FIG. 6 illustrates sampling of an electrical clock reference in accordance with a preferred embodiment of the present invention.

FIG. 6 illustrates selection of samples. In FIG. 6, a waveform 85 represents electrical clock reference signal 41. Y-axis 81 provides a reference for the amplitude of electrical clock reference signal 41. X-axis 82 provides a reference for elapsed time.

Marks 8, marks 86 and marks 87 represent sampled values of electrical clock reference signal 41 as received by time base calculation circuit 49 via converted signal 44. A dashed line 83 represents a top amplitude for a high slope window within which samples from electrical clock reference signal 41 are utilized. A dashed line 84 represents a bottom amplitude for the high slope window within which samples from electrical clock reference signal 41 are utilized.

Marks 8 represent sampled values of electrical clock reference signal 41 within the high slope window. When these samples are taken the slope of electrical clock reference signal 41 is steep. This means that at this point amplitude is changing fairly rapidly with respect to time so that from the amplitude, phase of electrical clock reference signal 41 can be determined with a good amount of accuracy.

Marks 86 represent sampled values of electrical clock reference signal 41 with amplitudes above the top amplitude represented by dashed line 83. Marks 86 are thus outside the high slope window and the represented sampled values are not used.

Marks 87 represent sampled values of electrical clock reference signal 41 with amplitudes below the bottom amplitude represented by dashed line 84. Marks 87 are thus outside the high slope window and the represented sampled values are not used.

In order to assure that there are sufficient sampled values within the high slope window, if electrical clock reference signal 41 and strobe signal 45 are harmonically related, it may be necessary to slightly change the frequency of either electrical clock reference signal 41 and strobe signal 45.

In a step 62 of the flowchart shown in FIG. 5, two possible sequences for converted signal 44 are constructed. For the first construct, it is assumed that the first sample is on the rising edge of the electrical clock reference signal 41. For the second construct, it is assumed that the first sample is on the falling edge of the electrical clock reference signal 41.

In a step 63, the actual sampled values of electrical clock reference signal 41 are compared with the sequences calculated in step 62. The sampled values of electrical clock reference signal 41 are fit to a curve using least square error or other curve fitting approaches to obtain a self-consistent description of sampled values of electrical clock reference signal 41 with the smallest accumulated error.

In a step 64, the approximate phase difference between each sampled value and the phase of the first sampled value is determined, and the phase calculation is extended to all sampled values.

In a step 65, the calculated phase is adjusted on an on-going basis to track the low frequency jitter. Because of low frequency jitter, the calculated phase value may differ slightly from a subsequent measured value whose phase detector output falls in the high-slope window. For this reason the low frequency jitter is tracked.

When tracking the low frequency jitter, the phase of measured sampled values whose phase detector outputs is within the high-slope window are assumed to be correct. Phase values for intermediate sampled values, whose amplitude values are outside the high slope window are interpolated assuming equal phase change between each sampled value.

It is possible to simplify the curve fitting algorithms by directly measuring the input frequency of electrical clock reference signal 41 and the frequency of strobe signal 45, for example, with a counter. Then the fractional part of the ratio of their frequencies can be used to fairly accurately predict the phase of successive samples. Adding a running additive phase term at each sampled value where electrical clock reference 41 can be accurately measured in the high slope window can refine this first guess. The integer part of this direct frequency ratio measurement is useful for triggered measurements, as described below. In addition, by accurately measuring the frequency of strobe signal 45 in the factory, and for each measurement obtaining the ratio of electrical clock reference signal 41 to strobe signal 45 frequency, the absolute frequency of electrical clock reference signal 41 is obtained. This can be used to give an absolute time axis to the oscilloscope trace, in picoseconds rather than in fractions of a bit period.

In some cases, jitter in the time base can be reduced by only using sampled values of electrical clock reference signal 41 that are in the high slope window and are inferred to be on the rising edge of the electrical clock reference signal 41. This will eliminate time base errors caused by not accurately knowing the exact shape of electrical clock reference signal 41. Not as many sampled points are used, but if the frequency of strobe signal 45 is reasonably stable, better results may be obtained.

Using standard available components to implement the embodiment of the invention disclosed in FIG. 4, a time base jitter of approximately 4 femtoseconds (fs) has been calculated. This is a significant improvement over current high-speed sampling oscilloscopes that typically have a time base jitter of several picoseconds (ps).

The embodiment of the present invention disclosed in FIG. 4 requires only one phase detector (optical sampler 37) for electrical clock reference 41. Low frequency jitter of the strobe signal 45 does not need to be controlled. The frequency of strobe signal 45 does not need to be phase-locked to the input data rate. This reduces the ring laser cost. The phase measurement can be made over a wide frequency range. A frequency range of 1–40 GHz is achievable assuming a sinusoidal electrical clock reference signal 41 or switchable low-pass filters on the clock reference. Phase locked ring lasers, by contrast, have a tuning range of perhaps 10 MHz at 10 GHz. The time base is self-calibrating using electrical clock reference signal 41 and strobe signal 45. Residual time base errors are small and can be estimated. The approach can be generalized to triggered measurements without adding additional hardware.

Optical sampling oscilloscope 31, as described above, is limited to measuring the phase of each time sample in the bit period of clock reference signal 41. The clock reference signal may be at a sub-multiple of the system data rate.

Figure 7:
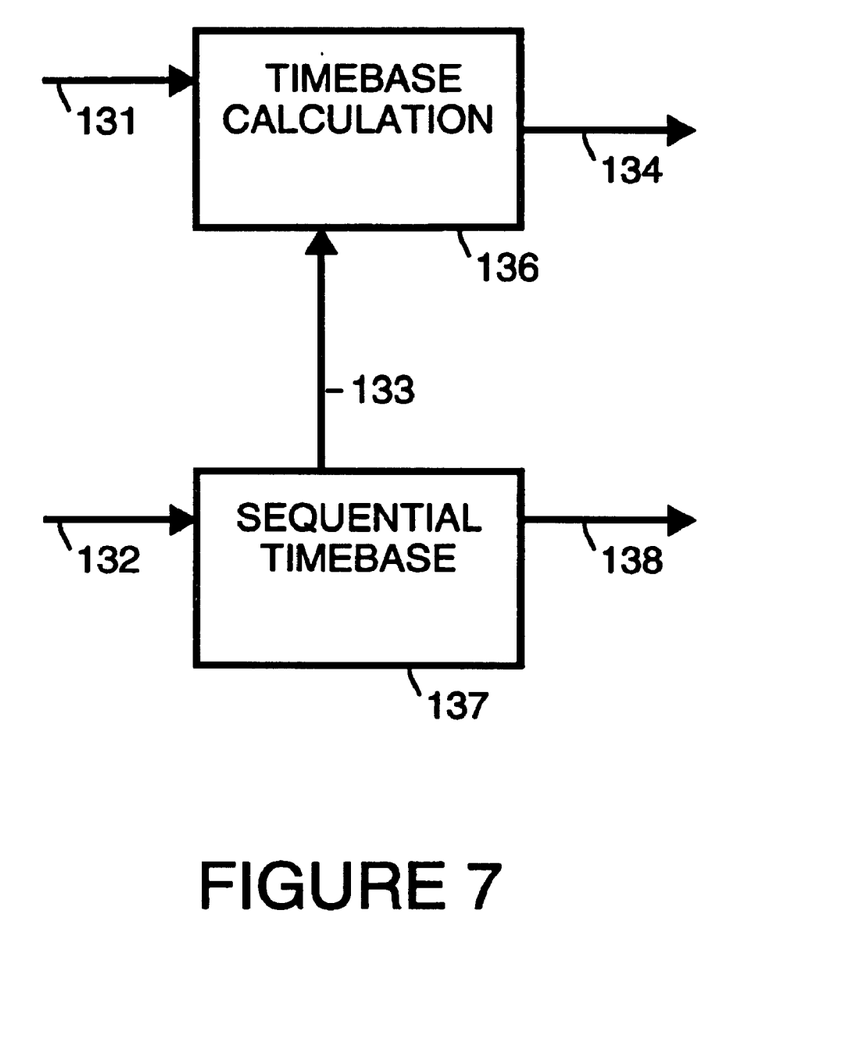
FIG. 7 illustrates a clock reference being used in conjunction with a sequential time base used to "clean up" the jitter on a pattern trigger signal when using a common sampling strobe in accordance with a preferred embodiment of the present invention.

FIG. 7 illustrates a clock reference 131 being used in conjunction with a sequential time base 137. Sequential time base 137 is used to "clean up" the jitter on a pattern trigger signal 132 when using a common sampling strobe 138. For example, pattern trigger signal 132 is a repetitive digital pattern that has a pattern trigger that always occurs at a selected bit position in the pattern. Sequential time base 137 triggers on this bit and produces a triggered waveform (a series of bits rather than an eye-diagram). However, jitter in the sequential time base 137 and input pattern trigger 132 will jitter or smear the observed waveform. If the jitter is less than one unit interval (one bit), time base calculation 136 can use clock reference 131 to fine-tune the time position to eliminate the jitter in a time axis value 134. In the preferred embodiment, clock reference 131 is sampled by a strobe signal with a known frequency.

Sequential time base 137 generates a sequential time base sampling delay 133 that indicates delay between pattern trigger signal 132 and common sampling strobe 138. Time base calculation 136 uses sequential time base sampling delay 133 along with clock reference 131 to accurately calculate the timing of common sampling strobe 138. Clock reference 131 is used to compensate for jitter and non-linearity within sequential time base 137 and input pattern trigger 132.

Sampling can be either optical or electrical. Alternatively, sampling can be performed using some other method or combination of methods. For example, the vertical channel can be obtained by optical sampling, while the clock reference is sampled electrically.

Figure 8:
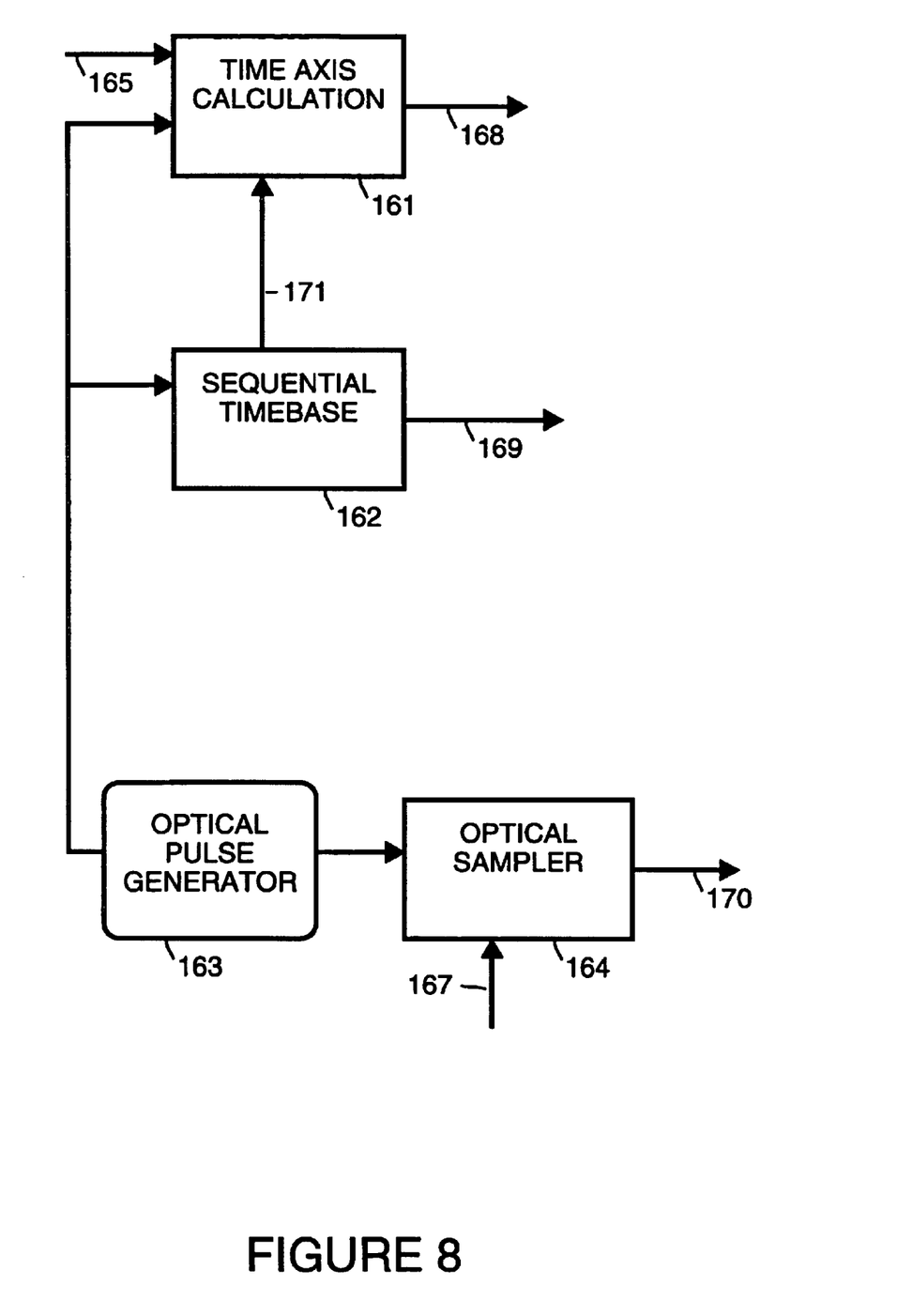
FIG. 8 illustrates an embodiment of the present invention that uses electrical sampling of electrical clock reference channel inputs and optical sampling of vertical axis input in accordance with a preferred embodiment of the present invention.

FIG. 8 illustrates an embodiment which uses electrical sampling of electrical clock reference channel inputs 165 and optical sampling of vertical axis input 167. Optical pulse generator 163 (optical pulse source) is asynchronous to electrical clock reference channel inputs 165 (the electrical clock reference). The timing of a sampling strobe (trigger) 171 for electrical clock reference channel inputs 165 is obtained from an optical pulse generator 163 with a trigger from sequential time base 162. In one embodiment, sampling strobe 171 from sequential time base 162 has significant jitter. An electrically detected output from optical pulse generator 163 goes into one of the vertical channels of the system. Sampling strobe 171 from sequential time base 162 is essentially the same signal. By suitably delaying the vertical channel relative to sampling strobe 171 signal, the vertical channel can be used to measure itself for a fixed delay. This gives a slope of vertical signal level versus sampling time that can be used to compensate for jitter in the sequential time base. This is an example of performing a time jitter compensation using only a single vertical channel.

Sequential time base 162 always samples the electrically detected optical pulse at nearly the same point on the slope. Due to jitter this point will vary up and down. The optical pulse clock from optical pulse generator 163 is not harmonically synchronized with respect to electrical clock reference channel inputs 165 so the samples will fall at different phase points on the user data. This data is sorted by the time axis calculation 161. A time axis measurement 168 is generated for use in displaying data to a user. In the preferred embodiment, the frequency of optical pulse clock from optical pulse generator 163 is known.

For example, in a 40 gigabyte per second (Gb/s) system the clock reference signal could be at 10 Gb/s. In this case, four bits of data will appear in one period of the clock reference signal. Often a high-speed optical signal, for example 40 Gb/s, is formed by optically combining four independent 10 Gb/s data streams. Any time skew between the data streams in the multiplexing process can be observed using the above quasi-periodic sampling scheme on the 10 GHz electrical clock reference signal. If in the above case the 40 Gb/s data pattern is repetitive and four bits long, a "triggered" waveform will be displayed—rather than an eye diagram. The clock reference signal can be further divided down (for example, to 2.5 GHz) to observe a longer repetitive pattern, though the jitter performance will be degraded. This "hardware" approach is cumbersome and is limited to only fixed divide ratios (pattern lengths).

Using the quasi-periodic sampling approach described above, triggered patterns can be obtained for arbitrary pattern lengths (with some practical restrictions).

In the discussion above on quasi-periodic sampling, the time axis of the oscilloscope display is assumed to be one bit period. The measured optical samples of the electrical clock reference are then used to determine the position of that sample within this unit bit interval. In general, the frequency of the electrical clock reference is much greater than the optical pulse frequency. For example, the electrical clock reference might be at 9.952 GHz and the optical pulse at 50 MHz. Thus the ratio is 199.040. For the purposes of constructing an eye-diagram the integer part of this ratio (199) has no impact on the measurement. The fractional part (0.040) determines the relative time placement of each successive sample in the eye. With no knowledge of the integer part, the fractional part can be deduced from the measured data. However if the actual ratio (integer and fractional parts) is measured, or the user inputs the measurement frequency (of the electrical clock reference) and the frequency of the optical pulse source is characterized in the factory, then pattern trigger becomes possible. Note that in limited cases the integer part can be deduced from the measured data as described below.

Basically, if the integer and fractional parts are known then the exact location in time of each sample is known. Thus, the user can choose an arbitrary span for the time base of the oscilloscope. In general, for pattern trigger, a time span equal to the pattern repetition period is chosen. In short, the user inputs the length of the pattern (for example, 127 for a $2^7-1$ pseudo random bit sequence (PRBS) pattern) and an appropriate horizontal time scale (127 bits) is used to reconstruct the data. On the display, the entire sequence need not be shown. But data is collected randomly for the entire pattern. The resulting trace will be a triggered waveform, which can be averaged. If the exact value of the integer part of the divide ratio (199 in the discussion above) is not known, different values can be tried until a triggered waveform is obtained.

The starting position in the pattern is arbitrary. However, if the input pattern is known the oscilloscope software (at a high level) can view the trace and shift it (rotate) until a user chosen bit is at the start of the sequence. This can be useful to overlay several independent traces for further averaging.

Because the sampling frequency is not harmonically related to the clock reference or the data signal, all bits of the pattern are sampled equally. If the pattern is long (for example a $2^{31}-1$ PRBS pattern; approximately 2 billion bits long) then very few samples per bit are obtained (even at a 50 million sample/second rate). This sets a practical limitation of pattern lengths up to—1000 bits ($2^{10}-1$ PRBS). However, the advantage of this sampling approach is that as soon as a complete data set is obtained for the first bit, data has also been collected for the entire pattern sequence. Hence eye-line mode, in which successive transitions of the pattern are overlaid to form an averaged eye diagram, becomes much faster. In one data record of 1 million samples (taken in 20 ms) all the data is available to construct a $2^{10}-1$ PRBS eye-line mode display. In a conventional electrical sequential scope a trace, measurements at each bit position might take 0.5 seconds to acquire so that all 1023 bits would take approximately 8 minutes.

If the frequency of the optical pulse source is sufficiently tunable, it is possible to choose a frequency for the optical pulser such that:

$$M*opt\_freq=N*pattern\_freq+delta$$

Where pattern_freq is the frequency of the repetition of the pattern (typically the electrical clock reference frequency/ pattern length). For example, if opt freq=50 MHz and pattern_freq=1 kHz for a $2^{23}-1$ PRBS pattern (pattern length=approximately 8 million) at 8 GHz. Then for M=1 and N=5000 a small value of delta can be chosen. Then it is possible to "walk through" the pattern by looking at every 5000th sample. This then becomes sequential sampling and pattern triggers can be performed even on longer patterns like this. For this example, a triggered measurement of 1000 points would require 1000 times 5000 samples equals 5 million samples which would require 100 ms measurement time.

Another possibility with pattern trigger mode and a high sample rate is that simple bit error ratio (BER) measurements and BER contours can be made on the oscilloscope. For example, assume the bit period is divided into 10 time slices of 1/10 bit period, and a triggered measurement made on a suitably short pattern. In two seconds, approximately 10 million bits will be acquired in each time slice. Thus true BER contours of the eye can be constructed down to the $10^{-7}$ BER threshold and with a time resolution of 1/10 bit period. In manufacturing compliance testing, true BER measurements to the $10^{-6}$ BER level could be obtained in—200 ms (accurate vertical eye-opening and crude approximately 10% phase margin data would also be obtained). The quasi-periodic sampling scheme does not have issues with false triggers like traditional sequential sampling, so true BER can be obtained. If optical sampling is used to measure the incoming optical signal, the wide bandwidth will introduce more noise.

Mask compliance testing can be performed with an eye-mask that covers a greater fraction of the bit period than 10%. If the mask covered 40% of the eye, then compliance testing to the $10^{-7}$ BER level could be obtained in 500 ms. Mask compliance testing can be performed for arbitrary length patterns. The BER measured as described here may not be the same as that obtained with an optical detector followed by a narrower-band electrical filter.

The pattern trigger system described herein works well for arbitrary patterns up to approximately 1000 bits when the pattern length and exact clock frequency is known (or measured). The pattern trigger system can work for longer patterns if the frequency of the optical pulse source can be adjusted. No external pattern trigger is required, but only a clock signal at the bit rate. Eye-line mode for a full trace is fast for up to 1000 bit patterns. With pattern trigger, data for true BER contours to $10^{-7}$ BER can be taken in approximately 2 seconds. Mask compliance testing to $10^{-7}$ BER can be performed on arbitrary length patterns in approximately 500 ms.

Figure 9:
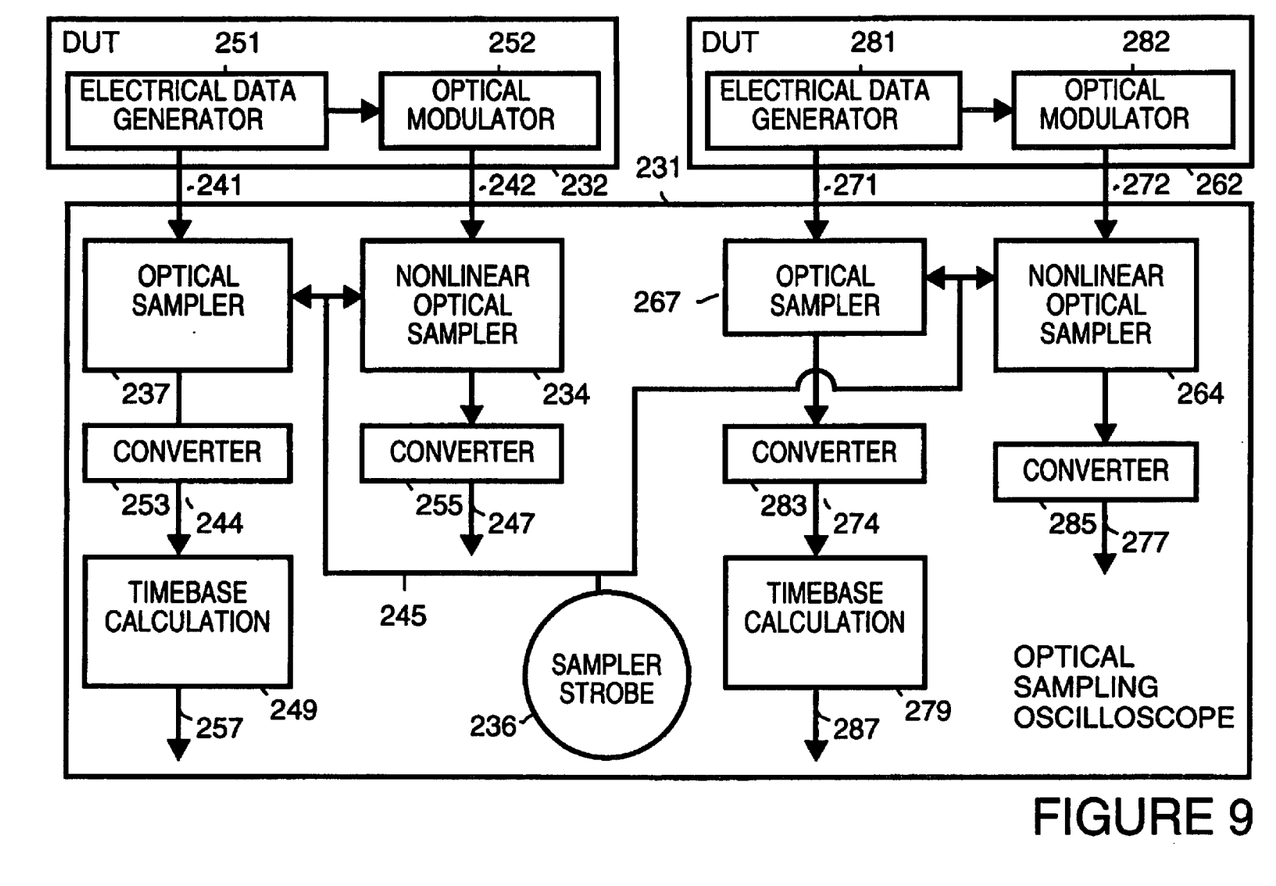
FIG. 9 is a simplified block diagram of a multiple channel optical sampling oscilloscope in accordance with an alternative preferred embodiment of the present invention.

FIG. 9 is a simplified block diagram of a multiple channel optical sampling oscilloscope 23. Optical sampling oscilloscope 231 is used, for example, to sample signals with bandwidths much higher than could be sampled by electrical sampling oscilloscope 11.

A device under test 232 includes an electrical data generator 251 and an optical modulator 252. Electrical data generator 251 supplies to optical sampling oscilloscope 231 an electrical clock reference signal 241. Optical modulator 252 supplies to optical sampling oscilloscope 231 an optical data signal 242. Electrical clock reference signal 241 is synchronized with optical data signal 242.

Electrical clock reference signal 241 is used for horizontal time base information. Optical data signal 242 is synchronous with electrical clock reference signal 241. Optical data signal 242 is used for the vertical channel information.

A sampler strobe 236 is used to simultaneously strobe a non-linear optical sampler 234, and an optical sampler 237 with a strobe signal 245. Non-linear optical sampler 234 and optical sampler 237 thus sample at the same time.

Sampler strobe 236 is implemented, for example, using an optical pulse source, such as a passively mode-locked fiber ring laser. Such an optical pulse source typically has excellent phase noise at high frequencies.

Non-linear optical sampler 234 samples optical data signal 242. A slow optical/electrical and analog to digital converter 255 provides a vertical channel signal 247 which provides the vertical channel information used by oscilloscope 231 to generate a display.

Optical sampler 237 samples electrical clock reference signal 241 and forwards the results to a slow optical/ electrical and analog to digital converter 253. Slow optical/ electrical and analog to digital converter 253 sends a converted signal 244 to a time base calculation circuit 249. Time base calculation circuit 249 produces a time axis channel information reference signal 257.

For example, optical sampler 237 and optical sampler 238 are each implemented using a Mach Zehnder optical modulator. Alternatively, optical sampler 237 and/or optical sampler 238 can be implemented, for example, with a photo-conductive switch (PCS) or other sampling device.

Non-linear optical sampler 234 converts the wavelength of optical data signal 242 during the time aperture of the optical sampling pulse. The wavelength converted output is optically filtered and measured with a slow optical detector (e.g., a slow optical/electrical and analog to digital converter that measures converted pulse energy).

A device under test 262 includes an electrical data generator 281 and an optical modulator 282. Electrical data generator 281 supplies to optical sampling oscilloscope 231 an electrical clock reference signal 271. Optical modulator 282 supplies to optical sampling oscilloscope 231 an optical data signal 272. Electrical clock reference signal 271 is synchronized with optical data signal 272.

Electrical clock reference signal 271 is used for horizontal time base information. Optical data signal 272 is synchronous with electrical clock reference signal 271. Optical data signal 272 is used for the vertical channel information.

Sampler strobe 236 is used to simultaneously strobe a non-linear optical sampler 264, and an optical sampler 267 with strobe signal 245. Non-linear optical sampler 264 and optical sampler 267 thus sample at the same time.

Non-linear optical sampler 264 samples optical data signal 272. A slow optical/electrical and analog to digital converter 285 provides a vertical channel signal 277 which provides the vertical channel information used by oscilloscope 231 to generate a display for vertical channel signal 277.

Optical sampler 267 samples electrical clock reference signal 271 and forwards the results to a slow optical/electrical and analog to digital converter 283. Slow optical/electrical and analog to digital converter 283 sends a converted signal 274 to a time base calculation circuit 279. Time base calculation circuit 279 produces a time axis channel information reference signal 287. In an alternative embodiment, only a single time base calculation circuit is used so that time base calculation circuit 249 performs all the calculations and time base calculation circuit 279 is unnecessary.

For example, optical sampler 267 and optical sampler 268 are each implemented using a Mach Zehnder optical modulator. Alternatively, optical sampler 267 and/or optical sampler 268 can be implemented, for example, with a photoconductive switch (PCS) or other sampling device.

Non-linear optical sampler 264 converts the wavelength of optical data signal 272 during the time aperture of the optical sampling pulse. The wavelength converted output is optically filtered and measured with a slow optical detector (e.g., a slow optical/electrical and analog to digital converter that measures converted pulse energy).

Figure 10:
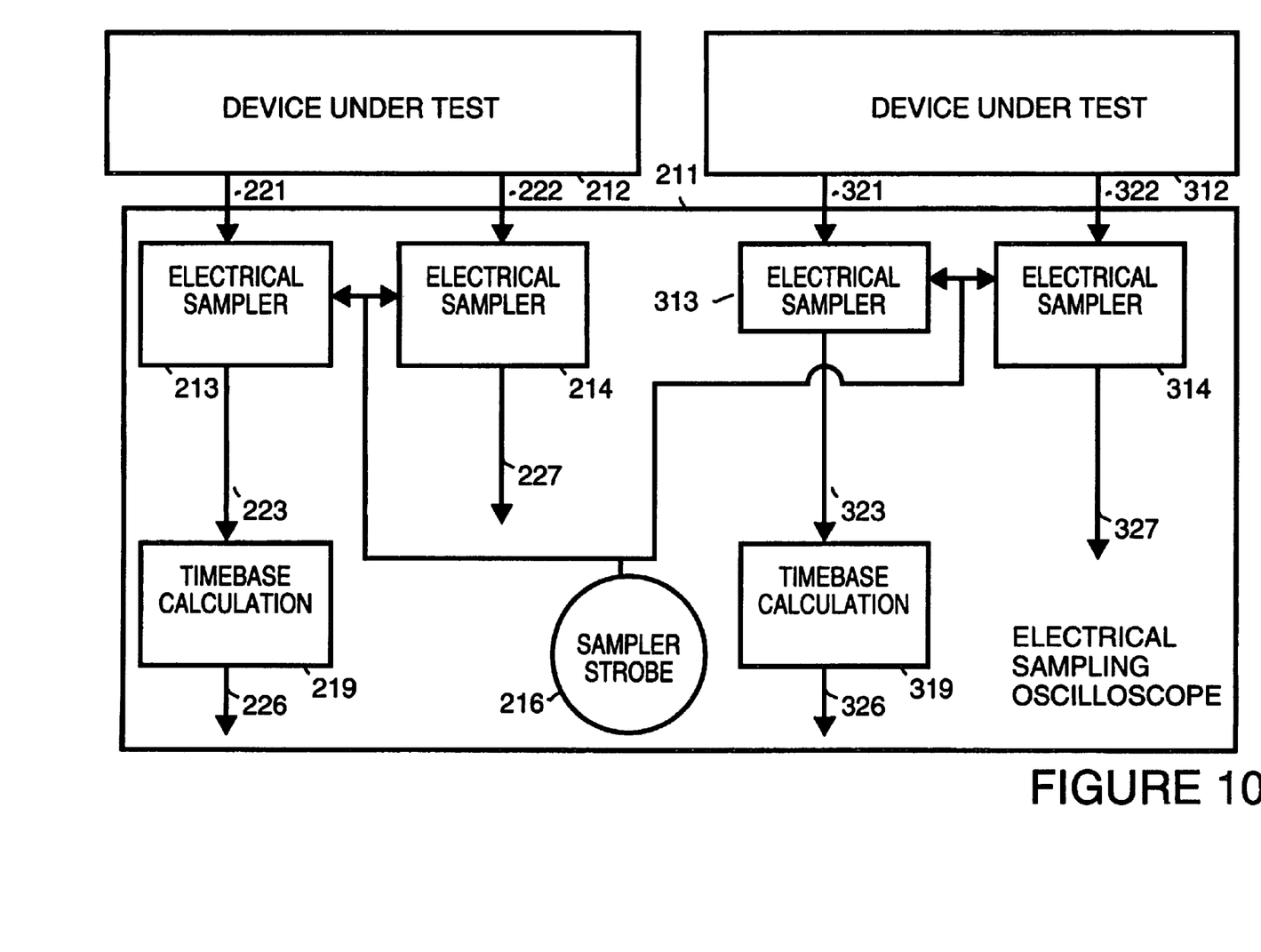
FIG. 10 is a simplified block diagram of a multiple channel electrical sampling oscilloscope in accordance with an alternative preferred embodiment of the present invention.

FIG. 10 is a simplified block diagram of a multiple channel electrical sampling oscilloscope 211, also called a digital communications analyzer. A device under test 212 supplies to electrical sampling oscilloscope 211 a digital electrical data signal 222 and a synchronous electrical clock reference signal 221. Synchronous electrical clock reference signal 221 is used for horizontal time base information. Digital electrical data signal 222 is synchronous with electrical clock reference signal 221. Digital electrical data signal 222 is used for the vertical channel information.

A sampler strobe 216 is used to simultaneously strobe an electrical sampler 214 and an electrical sampler 213. Electrical sampler 214 and electrical sampler 213 thus sample at the same time. The strobe signal generated by sampler strobe 216 operates at a known frequency. Sampling at a known frequency allows a resolution of ambiguity as to whether each sampled point is on a rising or falling edge of electrical clock reference signal 221 and allows for improved accuracy at sampled points where the slope of electrical clock reference signal 221 verses time is small.

Electrical sampler 214 samples digital electrical data signal 222 and provides a vertical channel signal 227 which provides the vertical channel information used by oscilloscope 211 to generate a display.

Electrical sampler 213 samples synchronous electrical clock reference signal 221 and forwards results 223 to a time base calculation circuit 219. Time base calculation circuit 219 produces a time axis channel information reference signal 226.

Additionally, a device under test 312 supplies to electrical sampling oscilloscope 211 a digital electrical data signal 322 and a synchronous electrical clock reference signal 321. Synchronous electrical clock reference signal 321 is used for horizontal time base information. Digital electrical data signal 322 is synchronous with electrical clock reference signal 321. Digital electrical data signal 322 is used for the vertical channel information.

Sampler strobe 216 is used to simultaneously strobe an electrical sampler 314 and an electrical sampler 313. Electrical sampler 314 and electrical sampler 313 thus sample at the same time as electrical sampler 213 and electrical sampler 214. The strobe signal generated by sampler strobe 216 operates at a known frequency. Sampling at a known frequency allows a resolution of ambiguity as to whether each sampled point is on a rising or falling edge of electrical clock reference signal 321 and allows for improved accuracy at sampled points where the slope of electrical clock reference signal 321 verses time is small.

Electrical sampler 314 samples digital electrical data signal 322 and provides a vertical channel signal 327 which provides the vertical channel information used by oscilloscope 211 to generate a display.

Electrical sampler 313 samples synchronous electrical clock reference signal 321 and forwards results 323 to a time base calculation circuit 319. Time base calculation circuit 319 produces a time axis channel information reference signal 326.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A method for performing repetitive sampling of a data signal, the method comprising the following steps:

(a) generating a clock reference, wherein the clock reference has a known period relationship with the data signal;

(b) sampling, at a known frequency, the clock reference;

(c) sampling the data signal, wherein there is a known time relationship between the sampling of the clock reference and the sampling of the data signal; and, (d) using sampled information from the clock reference and the known frequency at which the clock reference is sampled, to determine in what phase of the clock reference sampled values of the data signal occur.

2. A method as in claim 1 wherein step (d) includes the following substep:

(d.1) discarding sampled values of the clock reference for every sampled value where an amplitude of the sampled value indicates a rate of change of amplitude of the clock reference is below a predetermined minimum value.

3. A method as in claim 1 wherein step (d) includes the following substeps:

(d.1) discarding sampled values of the clock reference for every sampled value where an amplitude of the sampled value indicates a rate of change of amplitude of the clock reference is below a predetermined minimum value; and, (d.2) replacing the sampled values discarded in substep (d.1) by using sampled values of the clock reference not discarded in substep (d.1) and the known frequency at which the clock reference is sampled to estimate a phase of the clock reference at which each discarded sampled value occurred.

4. A method as in claim 1 wherein in step (b) and step (c) the sampling of the clock reference and the sampling of the data signal is simultaneous.

5. A method as in claim 4 wherein in step (d) information about phase determined in step (d) is used to correct timing errors in sampling the repetitive digital pattern.

6. A method as in claim 1 wherein in step (a) the data signal is a repetitive digital pattern that has a pattern trigger that always occurs at a selected bit position in the repetitive digital pattern.

7. A method as in claim 1 wherein sampling of the clock reference in step (b) and sampling of the data signal in step (c) are performed with a known time relationship to a sequential time base trigger.

8. A method as in claim 1 wherein in step (a) the clock reference is composed of a single signal with a waveform roughly in a shape of a sine wave.

9. A method as in claim 1 wherein in step (b) the clock reference is optically sampled and wherein in step (c) the data signal is optically sampled.

10. A method as in claim 1 wherein in step (b) the clock reference is electronically sampled and wherein in step (c) the data signal is electronically sampled.

11. A method as in claim 1 wherein in step (b) the data signal is optically sampled and wherein in step (c) the clock reference is electronically sampled.

12. A device that performs repetitive sampling of a data signal, the device comprising:

a first sampling circuit for sampling the data signal;

a second sampling circuit for sampling, at a known frequency, a clock reference, wherein the clock reference has a known period relationship with the data signal;

a timing circuit for assuring a known time relationship between sampling performed by the first sampling circuit and the second sampling circuit; and, calculation circuitry that uses sampled information from the clock reference and the known frequency at which the second sampling circuit samples the clock reference to determine in what phase of the clock reference sampled values of the data signal occur.

13. A device as in claim 12 wherein the calculation circuitry discards sampled values of the clock reference for every sampled value where an amplitude of the sampled value indicates a rate of change of amplitude of the clock reference is below a predetermined minimum value.

14. A device as in claim 12 wherein the calculation circuitry discards sampled values of the clock reference for every sampled value where an amplitude of the sampled value indicates a rate of change of amplitude of the clock reference is below a predetermined minimum value and replaces the discarded sampled values by using sampled values of the clock reference not discarded and the known frequency at which the clock reference is sampled to estimate a phase of the clock reference at which each discarded sampled value occurred.

15. A device as in claim 12 wherein the data signal is a repetitive digital pattern that has a pattern trigger that always occurs at a selected bit position in the repetitive digital pattern.

16. A device as in claim 12 wherein the clock reference is composed of a single signal with a waveform roughly in a shape of a sawtooth.

17. A device as in claim 12 wherein the first sampling circuit performs optical sampling of the data signal and the second sampling circuit performs optical sampling of the clock reference.

18. A device as in claim 12 wherein the first sampling circuit performs optical sampling of the data signal and the second sampling circuit performs electrical sampling of the clock reference.

19. A device as in claim 12 wherein the first sampling circuit performs electrical sampling of the data signal and the second sampling circuit performs electrical sampling of the clock reference.

20. A device as in claim 12 wherein the timing circuit includes:

a sequential time base for generating a common sampling strobe.

21. A method for performing repetitive sampling of multiple data signals, the method comprising the following steps:

(a) generating a first clock reference, wherein the first clock reference has a known period relationship with a first data signal;

(b) sampling, at a known frequency, the first clock reference;

(c) sampling the first data signal, wherein there is a known time relationship between the sampling of the first clock reference and the sampling of the first data signal;

(d) using sampled information from the first clock reference and the known frequency at which the first clock reference is sampled, to determine in what phase of the first clock reference sampled values of the first data signal occur;

(e) generating a second clock reference, wherein the second clock reference has a known period relationship with a second data signal;

(f) sampling, at the known frequency, the second clock reference;

(g) sampling the second data signal, wherein there is a known time relationship between the sampling of the second clock reference and the sampling of the second data signal; and, (h) using sampled information from the second clock reference and the known frequency at which the second clock reference is sampled, to determine in what phase of the second clock reference sampled values of the second data signal occur.

22. A method as in claim 21 wherein step (d) includes the following substep:

(d.1) discarding sampled values of the first clock reference for every sampled value where an amplitude of the sampled value indicates a rate of change of amplitude of the first clock reference is below a predetermined minimum value.

23. A method as in claim 21 wherein step (d) includes the following substeps:

(d.1) discarding sampled values of the first clock reference for every sampled value where an amplitude of the sampled value indicates a rate of change of amplitude of the first clock reference is below a predetermined minimum value; and, (d.2) replacing the sampled values discarded in substep (d.1) by using sampled values of the first clock reference not discarded in substep (d.1) and the known frequency at which the first clock reference is sampled to estimate a phase of the first clock reference at which each discarded sampled value occurred.

24. A device that performs repetitive sampling of multiple data signals, the device comprising:

a first sampling circuit for sampling a first data signal;

a second sampling circuit for sampling, at a known frequency, a first clock reference, wherein the first clock reference has a known period relationship with the first data signal;

a timing circuit for assuring a known time relationship between sampling performed by the first sampling circuit and the second sampling circuit;

first calculation circuitry that uses sampled information from the first clock reference and the known frequency at which the second sampling circuit samples the first clock reference to determine in what phase of the first clock reference sampled values of the first data signal occur;

a third sampling circuit for sampling a second data signal;

a fourth sampling circuit for sampling, at a known frequency, a second clock reference, wherein the second clock reference has a known period relationship with the second data signal; and, second calculation circuitry that uses sampled information from the second clock reference and the known frequency at which the second sampling circuit samples the second clock reference to determine in what phase of the second clock reference sampled values of the second data signal occur;

wherein the timing circuit also assures a known time relationship between sampling performed by the third sampling circuit and the fourth sampling circuit.

25. A device as in claim 24 wherein the first calculation circuitry discards sampled values of the first clock reference for every sampled value where an amplitude of the sampled value indicates a rate of change of amplitude of the first clock reference is below a predetermined minimum value.

26. A device as in claim 24 wherein the first calculation circuitry discards sampled values of the first clock reference for every sampled value where an amplitude of the sampled value indicates a rate of change of amplitude of the first clock reference is below a predetermined minimum value and replaces the discarded sampled values by using sampled values of the first clock reference not discarded and the known frequency at which the first clock reference is sampled to estimate a phase of the first clock reference at which each discarded sampled value occurred.

* * * * *